(12) United States Patent
Im et al.

(10) Patent No.: US 7,704,862 B2
(45) Date of Patent: Apr. 27, 2010

(54) SURFACE PLANARIZATION OF THIN SILICON FILMS DURING AND AFTER PROCESSING BY THE SEQUENTIAL LATERAL SOLIDIFICATION METHOD

(75) Inventors: James S. Im, New York, NY (US); Robert S. Sposili, New York, NY (US); Mark A. Crowder, Portland, OR (US)

(73) Assignee: The Trustees of Columbia University, City of New York (*) Notice: Subject to any disclaimer, the term of this patent is extended or adjusted under 35 U.S.C. 154(b) by 0 days.

(21) Appl. No.: 11/671,917

(22) Filed: Feb. 6, 2007

(65) Prior Publication Data
US 2007/0145017 A1    Jun. 28, 2007

Related U.S. Application Data

(62) Division of application No. 10/939,271, filed on Sep. 13, 2004, now Pat. No. 7,220,660, which is a division of application No. 09/979,201, filed as application No. PCT/US00/07479 on Mar. 21, 2000, now Pat. No. 6,830,993.

(51) Int. Cl.
H01L 21/20    (2006.01)
(52) U.S. Cl. ............... 438/487; 438/795; 257/E21.077; 219/121.6
(58) Field of Classification Search ......... 438/486–489, 438/795; 257/E21.077, E21.082, E21.133; 216/121.6
See application file for complete search history.

(56) References Cited

U.S. PATENT DOCUMENTS 3,632,205 A    1/1972    Marcy (Continued)

FOREIGN PATENT DOCUMENTS

DE    19839718    3/2000

(Continued)

OTHER PUBLICATIONS

U.S. Appl. No. 60/253,256, filed Aug. 31, 2003, Im.

(Continued)

*Primary Examiner*—Charles D Garber
*Assistant Examiner*—Stanetta D Isaac
(74) *Attorney, Agent, or Firm*—Baker Botts LLP (57) ABSTRACT

Systems and methods for reducing a surface roughness of a polycrystalline or single crystal thin film produced by the sequential lateral solidification process are disclosed. In one arrangement, the system includes an excimer laser for generating a plurality of excimer laser pulses of a predetermined fluence, an energy density modulator for controllably modulating the fluence of the excimer laser pulses such that the fluence is below that which is required to completely melt the thin film, a beam homoginizer for homoginizing modulated laser pulses in a predetermined plane, a sample stage for receiving homoginized laser pulses to effect melting of portions of the polycrystalline or single crystal thin film corresponding to the laser pulses, translating means for controllably translating a relative position of the sample stage with respect to the laser pulses, and a computer for coordinating the excimer pulse generation and fluence modulation with the relative positions of the sample stage to thereby process the polycrystalline or single crystal thin film by sequential translation of the sample stage relative to the laser pulses.

8 Claims, 9 Drawing Sheets

U.S. PATENT DOCUMENTS

| | | |
|---|---|---|
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,844,588 A | 12/1998 | Anderson |
| 5,861,991 A | 1/1999 | Fork |
| 5,893,990 A | 4/1999 | Tanaka |
| 5,986,807 A | 11/1999 | Fork |
| 6,014,944 A | 1/2000 | Russell et al. |
| 6,020,224 A * | 2/2000 | Shimogaichi et al. ....... 438/158 |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,177,301 B1 | 1/2001 | Jung |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Farmiga et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,767,804 B2 | 7/2004 | Crowder |
| 6,770,545 B2 | 8/2004 | Yang |
| 6,784,455 B2 | 8/2004 | Maekawa et al. |
| 6,830,993 B1 | 12/2004 | Im et al. |
| 6,858,477 B2 | 2/2005 | Deane et al. |

| | | |
|---|---|---|
| 6,908,835 B2 | 6/2005 | Sposili et al. |
| 6,961,117 B2 | 11/2005 | Im |
| 7,091,411 B2 | 8/2006 | Falk et al. |
| 7,187,016 B2 | 3/2007 | Arima |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,341,928 B2 | 3/2008 | Im |
| 2001/0001745 A1 | 5/2001 | Im et al. |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059265 A1 | 3/2005 | Im |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2006/0030164 A1 | 2/2006 | Im |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0215942 A1 | 9/2007 | Chen et al. |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | 62181419 | 8/1987 |
| JP | 2283036 | 11/1990 |
| JP | 04033327 | 2/1992 |
| JP | 4279064 | 10/1992 |
| JP | 6252048 | 9/1994 |
| JP | 6283422 | 10/1994 |
| JP | 7176757 | 7/1995 |
| JP | 11064883 | 3/1999 |
| JP | 11281997 | 10/1999 |
| JP | 2001023920 | 1/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | 0231869 | 4/2002 |
| WO | 0242847 | 5/2002 |
| WO | 0286954 | 5/2002 |
| WO | 02086955 | 10/2002 |
| WO | 03018882 | 3/2003 |
| WO | 03046965 | 6/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | 2004075263 | 9/2004 |
| WO | WO2005029546 | 3/2005 |
| WO | WO2005029548 | 3/2005 |
| WO | WO2005029550 | 3/2005 |
| WO | WO2005029551 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).*.

Crowder et al., "Low-Temperature Single-Crystal Si TFT's Fabricated on Si Films processed via Sequential Lateral Solidification", IEEE Electron Device Letter, vol. 19 (8), p. 306 (1998).*.

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.*.

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH. 1999.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of A1-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". 1999.

Ishida et al., "Ultra-shallow boxlike profiles fabricated by pulsed ultraviolet-laser doping process", J. Vac. Sci. Technol. B 12(1), p. 399-403, 1994. (No month).

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q9.7.1-9.7.6, 2000.

Dassow, R. et al. Laser-Crystallized Polycrystalline Silicon on Glass for Photovoltaic Applications, Solid State Phenomena, pp. 193-198, vol. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in Al Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. And J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, U.S. Appl. No. 60/503,419; ref file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: a New Laser Annealing Tool with Lower Cost and Higher Yield for LTPS Panels," SID 00 Digest, pp. 1-3 , 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

Van Der Wilt, P.C., "State-of-the-Art Laser Crystallization of Si for Flat Panel Displays," PhAST, May 18, 2004, pp. 1-34.

Van Der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).

N. Yamamuchi and R. Reif, Journal of Applied Physics, "Polycrystalline silicon thin films processed with silicon ion implantation and subsequent solid-phase crystallization: Theory, experiments, and thin-film transistor applications"—Apr. 1, 1994—vol. 75, Issue 7, pp. 3235-3257.

T. Noguchi, "Appearance of Single-Crystalline Properties in Fine-Patterned Si Thin Film Transistors (TFTs) by Solid Phase Crystallization (SPC)," Jpn. J. Appl. Phys. vol. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.

\* cited by examiner

SURFACE PLANARIZATION OF THIN SILICON FILMS DURING AND AFTER PROCESSING BY THE SEQUENTIAL LATERAL SOLIDIFICATION METHOD

CROSS-REFERENCE TO RELATED APPLICATIONS

This application is a divisional of U.S. patent application Ser. No. 10/939,271, filed Sep. 13, 2004 now U.S. Pat. No. 7,220,660, which is a divisional of U.S. patent application Ser. No. 09/979,201, filed Feb. 4, 2002, now U.S. Pat. No. 6,830,993, issued Dec. 14, 2004, which is a national stage of International Application PCT/US00/07479, filed Mar. 21, 2000, each of which is incorporated by reference herein in its entirety and from which priority is claimed.

NOTICE OF GOVERNMENT RIGHTS

The U.S. Government has certain rights in this invention pursuant to the terms of the Defense Advanced Research Project Agency award number N66001-98-1-8913.

BACKGROUND OF THE INVENTION

I. Field of the Invention

The present invention relates to techniques for semiconductor processing, and more particularly to semiconductor processing which may be performed at low temperatures.

II. Description of the Related Art

In the field of semiconductor processing, there have been several attempts to use lasers to convert thin amorphous silicon films into polycrystalline films. An overview of conventional excimer laser annealing technology is presented by James Im et al. in "Crystalline Si Films for Integrated Active-Matrix Liquid-Crystal Displays," 11 MRS Bulletin 39 (1996). In systems used for carrying out excimer laser annealing, an excimer laser beam is shaped into a long beam which is typically up to 30 cm long and 500 micrometers or greater in width. The shaped beam is scanned over a sample of amorphous silicon to facilitate melting thereof and the formation of polycrystalline silicon upon resolidification of the sample.

The use of conventional excimer laser annealing technology to generate polycrystalline or single crystal silicon is problematic for several reasons. First, the silicon generated in the process is typically small grained, of a random microstructure, and/or has non-uniform grain sizes, which result in poor and non-uniform devices that lead to low manufacturing yield. Second, the processing techniques needed to obtain acceptable performance levels require that the manufacturing throughput for producing polycrystalline silicon be kept low. Also, these processes generally require a controlled atmosphere and preheating of the amorphous silicon sample, which lead to a further reduction in throughput rates. Finally, the fabricated films generally exhibit an unacceptable degree of surface roughness that can be problematic for performance of microelectronic devices.

There exists a need in the field to generate higher quality polycrystalline silicon and single crystal silicon at greater throughput rates. As well, there exists a need for manufacturing techniques that reduce the surface roughness of such polycrystalline and single crystal silicon thin films to be used in the fabrication of higher quality devices, such as flat panel displays.

SUMMARY OF THE INVENTION

An object of the present invention is to provide techniques for planarizing the surfaces of polycrystalline and single crystal thin film semiconductors.

A further object of the present invention is to provide surface planarization techniques that may be applied as a post processing step to polycrystalline and single crystal thin film semiconductors that are produced during a sequential lateral solidification process.

Yet a further object of the present invention is to provide surface planarization techniques that may be applied as a processing step during the production of polycrystalline and single crystal thin film semiconductors in a sequential lateral solidification process.

Yet another object of the present invention is to provide techniques for the fabrication of high quality semiconductors devices useful for fabricating displays and other products.

In order to achieve these objectives as well as others that will become apparent with reference to the following specification, the present invention provides systems and methods for reducing surface roughness of a polycrystalline or single crystal thin film that had previously been produced by the sequential lateral solidification process. In one arrangement, the system includes an excimer laser for generating a plurality of excimer laser pulses of a predetermined fluence, an energy density modulator for controllably modulating the fluence of the excimer laser pulses such that the fluence is below that which is required to completely melt the thin film, a beam homogenizer for homogenizing modulated laser pulses in a predetermined plane, a sample stage for receiving homogenized laser pulses to effect partial melting of portions of the polycrystalline or single crystal thin film corresponding to the laser pulses, translating means for controllably translating a relative position of the sample stage with respect to the laser pulses, and a computer for coordinating the excimer pulse generation and fluence modulation with the relative positions of the sample stage to thereby process the polycrystalline or single crystal thin film by sequential translation of the sample stage relative to the laser pulses. The excimer laser is preferably an ultraviolet excimer laser for generating ultraviolet excimer laser pulses.

In one arrangement, the beam homogenizer is operable to shape laser pulses with a tophat profile in both the x and y directions. The energy density modulator is operable to attenuate fluence of the excimer laser pulses to approximately 25% to 75% of the full melt threshold of the polycrystalline or single crystal thin film.

The translating stage advantageously includes an X direction translation portion and a Y direction translation portion, each being coupled to the computer and to each other and permitting movement in two orthogonal directions that are perpendicular to a path formed by the laser pulses, and being controllable by the computer for controllably translating the sample in both of said translatable directions under control of said computer. Also, the beam homogenizer is operable to shape said laser pulses with a tophat profile in both the x and y directions, and the translating means is operable to translate the polycrystalline or single crystal thin film in two directions orthogonal to a direction of said laser pulses such that sequential homogenized laser pulses are incident on slightly overlapping regions of the polycrystalline or single crystal thin film in the two directions.

In an alternative arrangement, the present invention provides for systems and methods for processing an amorphous silicon thin film sample into a single or polycrystalline silicon thin film having a reduced surface roughness. In one arrangement, the method includes forming a rigid cap layer on an amorphous silicon thin film sample having sufficient thickness to withstand contractions and expansions during melting and resolidification of the silicon thin film during the sequential lateral solidification process. The method also includes generating a sequence of excimer laser pulses; controllably modulating each excimer laser pulse in the sequence to a predetermined fluence; homogenizing each modulated laser pulse in the sequence in a predetermined plane; masking portions of each homogenized fluence controlled laser pulse in the sequence to generate a sequence of fluence controlled pulses of patterned beamlets, irradiating the amorphous silicon thin film sample with the sequence of fluence controlled patterned beamlets to effect melting of portions thereof; controllably sequentially translating the sample relative to each of said fluence controlled pulse of patterned beamlets to thereby process the amorphous silicon thin film sample into a single or polycrystalline silicon thin film having a reduced surface roughness; and removing said cap layer from the processed single or polycrystalline silicon thin film.

The accompanying drawings, which are incorporated and constitute part of this disclosure, illustrate a preferred embodiment of the invention and serve to explain the principles of the invention.

DESCRIPTION OF PREFERRED EMBODIMENTS

The present invention provides techniques for planarizing the surfaces of polycrystalline and single crystal thin film semiconductors. In the preferred embodiments, the surface planarization techniques are applied as a post processing step to polycrystalline and single crystal thin film semiconductors that are produced during a sequential lateral solidification process, or as a processing step during the production of polycrystalline and single crystal thin film semiconductors in a sequential lateral solidification process. Accordingly, in order to fully understand those techniques, the sequential lateral solidification process must first be appreciated.

The sequential lateral solidification process is a technique for producing large grained silicon structures through small-scale unidirectional translation of a silicon sample in between sequential pulses emitted by an excimer laser. As each pulse is absorbed by the sample, a small area of the sample is caused to melt completely and resolidify laterally into a crystal region produced by the preceding pulses of a pulse set.

A particularly advantageous sequential lateral solidification process and an apparatus to carry out that process are disclosed in our co-pending patent application Ser. No. 09/390,537, filed Sep. 3, 1999, entitled "Systems and Methods using Sequential Lateral Solidification for Producing Single or Polycrystalline Silicon Thin Films at Low Temperatures," the disclosure of which is incorporated by reference herein. While the foregoing disclosure is made with reference to the particular techniques described in our co-pending patent application, it should be understood that other sequential lateral solidification techniques could readily be adapted for use in the present invention.

Figure 1:
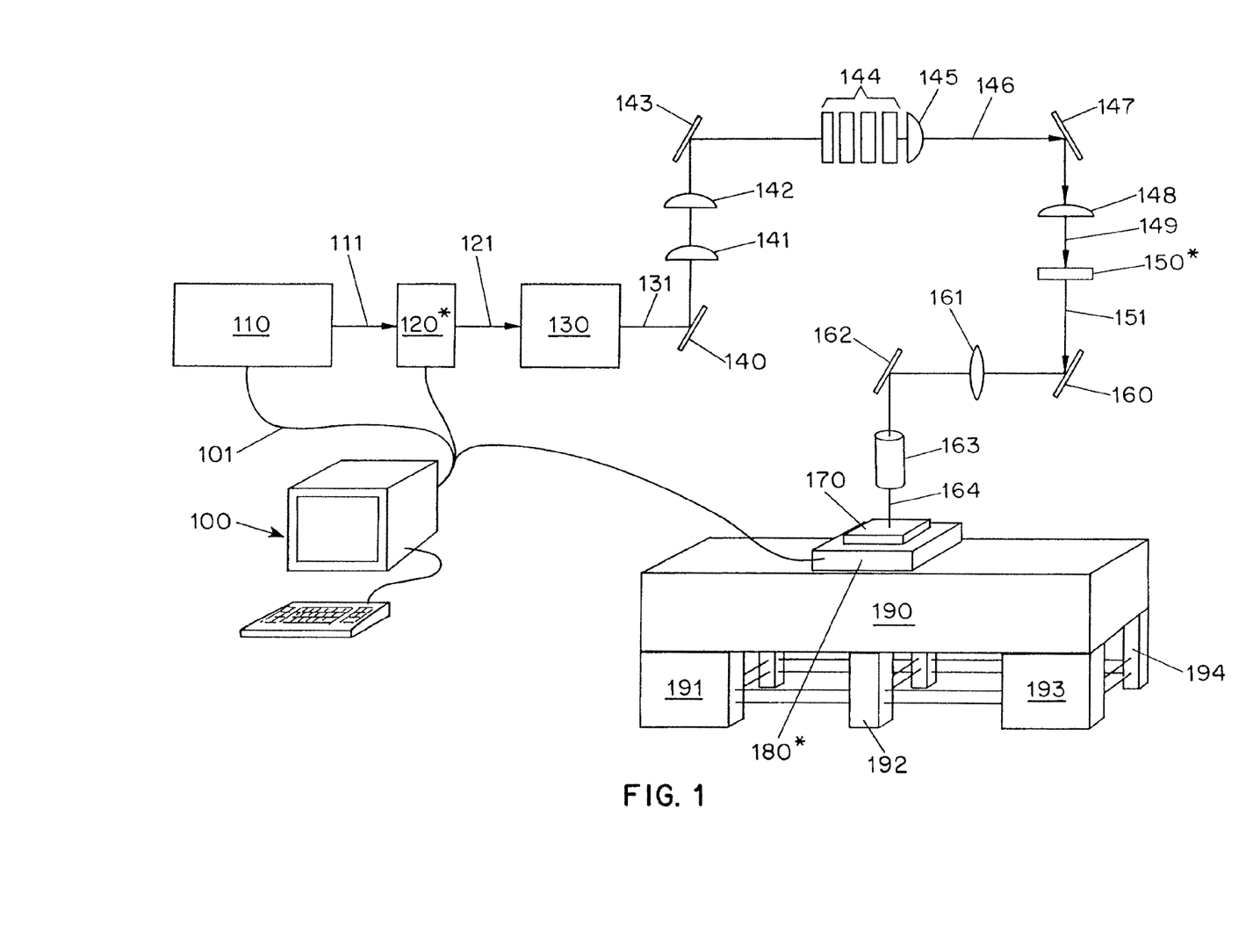
FIG. 1 is a functional diagram of a system for performing the sequential lateral solidification process preferred to implement a preferred process of the present invention.

With reference to FIG. 1, our co-pending patent application describes as a preferred embodiment a system including excimer laser 110, energy density modulator 120 to rapidly change the energy density of laser beam 111, beam attenuation and shutter 130, optics 140, 141, 142 and 143, beam homogenizer 144, lens system 145, 146, 148, masking system 150, lens system 161, 162, 163, incident laser pulse 164, thin silicon film sample 170, sample translation stage 180, granite block 190, support system 191, 192, 193, 194, 195, 196, and managing computer 100 X and Y direction translation of the silicon sample 170 may be effected by either movement of a mask 710 within masking system 150 or by movement of the sample translation stage 180 under the direction of computer 100.

As described in further detail in our co-pending application, an amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses in a predetermined plane, masking portions of the homogenized modulated laser pulses into patterned beamlets, irradiating an amorphous silicon thin film sample with the patterned beamlets to effect melting of portions thereof corresponding to the beamlets, and controllably translating the sample with respect to the patterned beamlets and with respect to the controlled modulation to thereby process the amorphous silicon thin film sample into a single or polycrystalline silicon thin film by sequential translation of the sample relative to the patterned beamlets and irradiation of the sample by patterned beamlets of varying fluence at corresponding sequential locations thereon.

Figure 2:
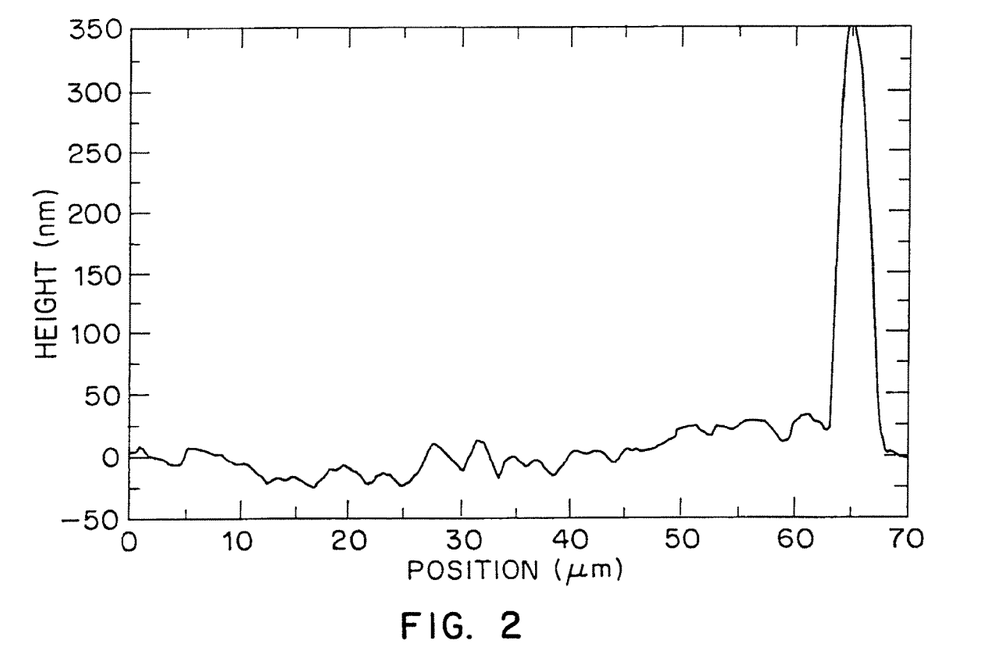
FIG. 2 is a chart showing the surface profile of a typical film which has been processed by the sequential lateral solidification system of FIG. 1.

While the sequential lateral solidification process is highly advantageous to produce single crystal or large grained polycrystalline silicon thin films, the produced crystals often exhibit a surface roughness due to the irrative nature of the melting and resolidification inherent in the crystal growth process. Thus, as shown in FIG. 2, a 200 nm thick crystal will exhibit variations in height throughout the length of the crystal. In FIG. 2, a height of 0 indicates the optimal height in a 200 nm thick crystal, and heights varying from 175 to 225 nm are shown to be common throughout the length of the crystal. Note the large bump 210 near the crystal boundary, where crystal thickness exceeds the optimal 200 nm thickness by 350 nm.

Figure 3:
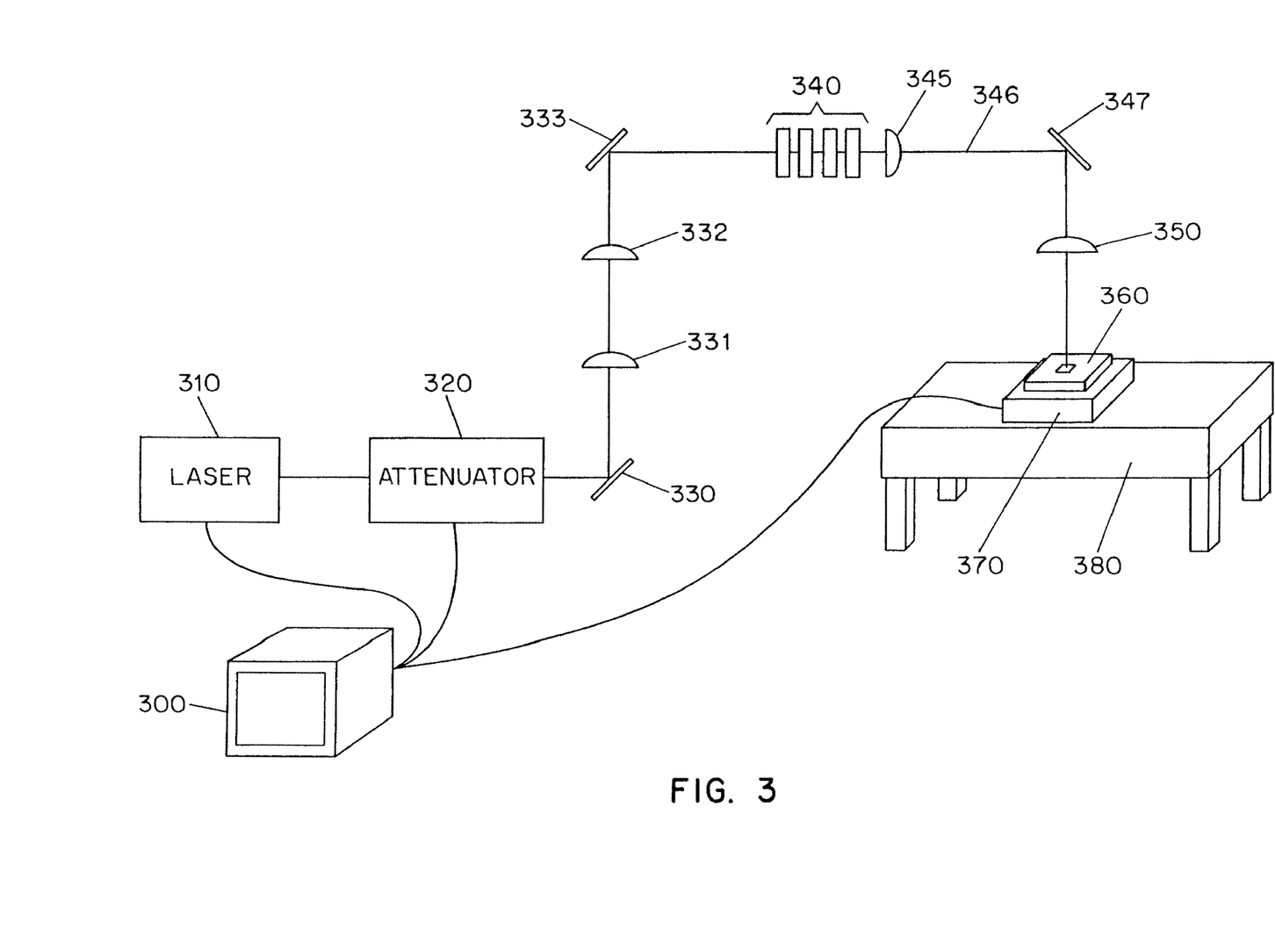
FIG. 3 is a functional diagram of a preferred system for planarizing the surface of a polycrystalline or single crystal thin film semiconductor produced during a sequential lateral solidification process in accordance with the present invention.
Figure 4A:
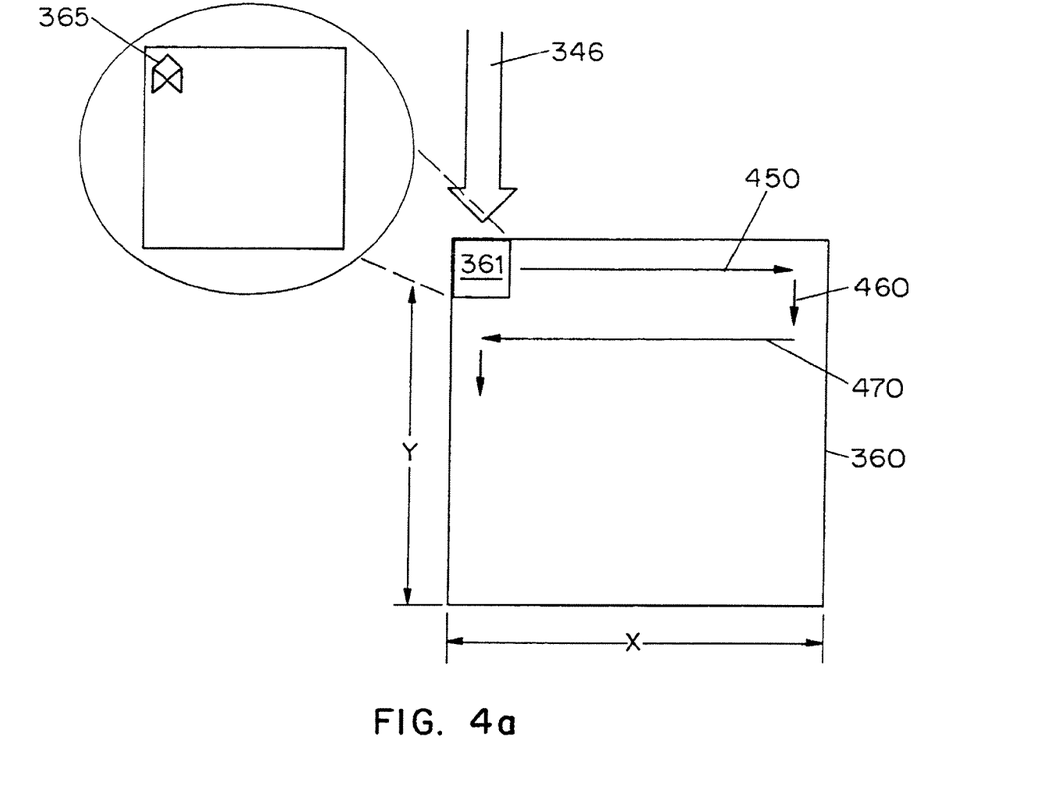
FIGS. 4a and 4b are illustrative diagrams of a crystallized silicon film to be processed by the system of FIG. 3 using a narrow beam.
Figure 4B:
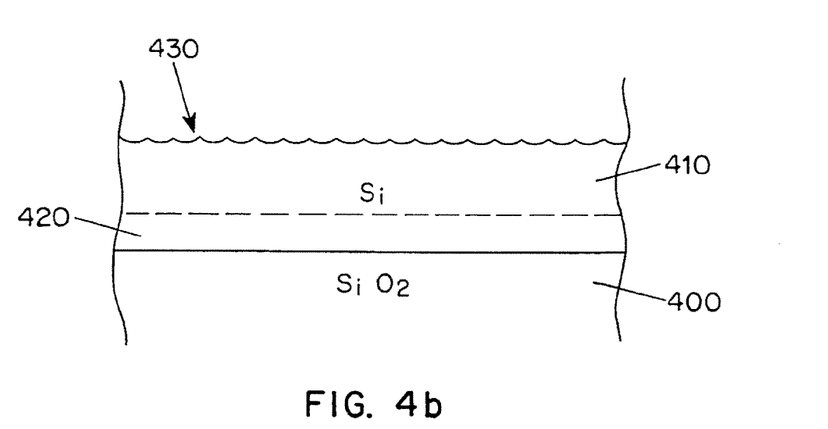

Referring to FIGS. 3 and 4, a first embodiment of the present invention will now be described. FIG. 3 illustrates a post processing system embodiment for planarizing polycrystalline and single crystal thin film semiconductors produced by the sequential lateral solidification process. The system includes an excimer laser 310, beam attenuator and shutter 320, reflecting plate 330, telescoping lenses 331, 332, reflecting plate 333, beam homogenizer 340, condensing lens 345, reflecting plate 347, field lense 350, sample 360, sample translation stage 370, optical table 380, and managing computer 300. A preferred laser 310, attenuator 320, telescoping lenses 332, 332, homogenizer 340, and sample translation stage 370 that is movable in two orthogonal directions are each described in the co-pending patent application Ser. No. 09/390,537. The table 380 may be as described in that patent document, or may be an ordinary table. It is preferable that the homogenized beam 346 be shaped with a tophat profile in both the x and y directions, and essential that the beam energy density is below that required to completely melt the sample 360.

With reference to FIGS. 4a and 4b, the sample 360 is shown in greater detail. Since the sample in this embodiment has already been processed, it already includes a large number of single crystal regions, shown illustratively as chevron shaped crystals 365. The homogenized beam 346 is shown incident upon a portion 361 of sample 360 to induce partial melting thereof.

For a 200 nm thick silicon thin film, the full melt threshold is approximately 600 mJ/cm2. Thus, to induce sufficient partial melting of the portion 361, a beam 346 having an energy that is approximately 25% to 75% of the full melt threshold should be utilized. If the beam is more energetic, energy fluctuations inherent in excimer lasers create the possibility of causing a full melt of the sample region 361. If the beam is less energetic, the sample portion 361 will not melt sufficiently to satisfactorily planarize.

As shown in FIG. 4b, the sample 360 includes a silicon oxide base layer 400 and a silicon layer 410. In accordance with the present invention, the outer surface of silicon layer 410 is caused to melt to a depth 420. Upon resolidification, the rough surface 430 is reformed in a more planarized manner.

While a single homogenized beam pulse having an energy that is approximately 25% to 75% of the full melt threshold is sufficient to induce partial melting of the region 361, it is preferred that multiple beam pulses are caused to irradiate every such region. Each subsequent beam pulse will induce partial melting of the region 361, which upon resolidification will exhibit a more planarized surface. Thus, the use of ten beam pulses per region 361 will produce a far smoother surface 430 than would the use of a single pulse.

Returning to FIG. 4a, the sample stage 370 is translated, under the control of computer 300, from right to left to cause the homogenized beam 346 to scan the sample 360 from left to right 450 on the top of sample 360. The stage 370 is then moved in an orthogonal direction (shown as the Y direction) to realign the sample at a new position 460, and translation in the opposite direction is began 470. This processes is repeated until the entire surface of sample 360 has been scanned by the homogenized beam 346.

When the sample stage is translated in the Y direction, it may be advantageous to align the homogenized beam to slightly overlap a previously scanned region of the sample 360. Thus, if the region 361 is 1.2×1.2 cm, Y direction translation of 1.15 cm may be utilized to avoid edge effects caused by irregularities in the homogenized beam. Likewise, it is advantageous to cause a slight overlap with X-direction translation is being effected.

Figure 5:
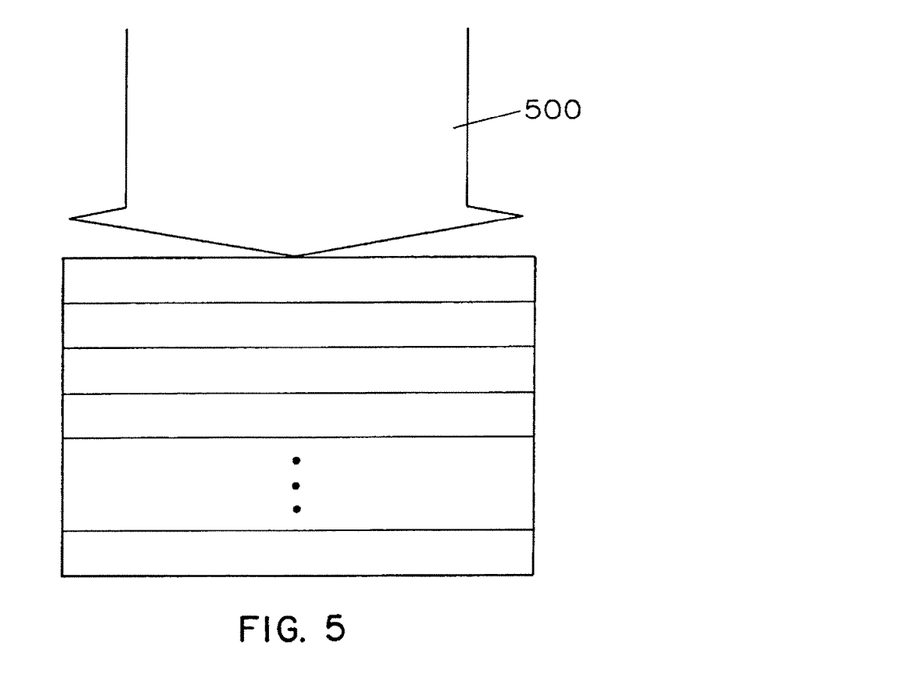
FIG. 5 is an illustrative diagram of a crystallized silicon film to be processed by the system of FIG. 3 using a wide beam.

While the foregoing has been described with respect to a tophat profile square homogenized beam, beams of other shapes may be utilized. Thus, as shown in FIG. 5, a wide homogenized beam 500 which is sufficiently wide to eliminated the need for X direction translation may be utilized, with the benefit of necessitating less movement by the translation stage 360, and adoringly, greater throughput. Likewise, a beam that is shaped with a Gaussian profile in the X direction could be utilized if greater overlaps between X translations are performed.

Figure 6A:
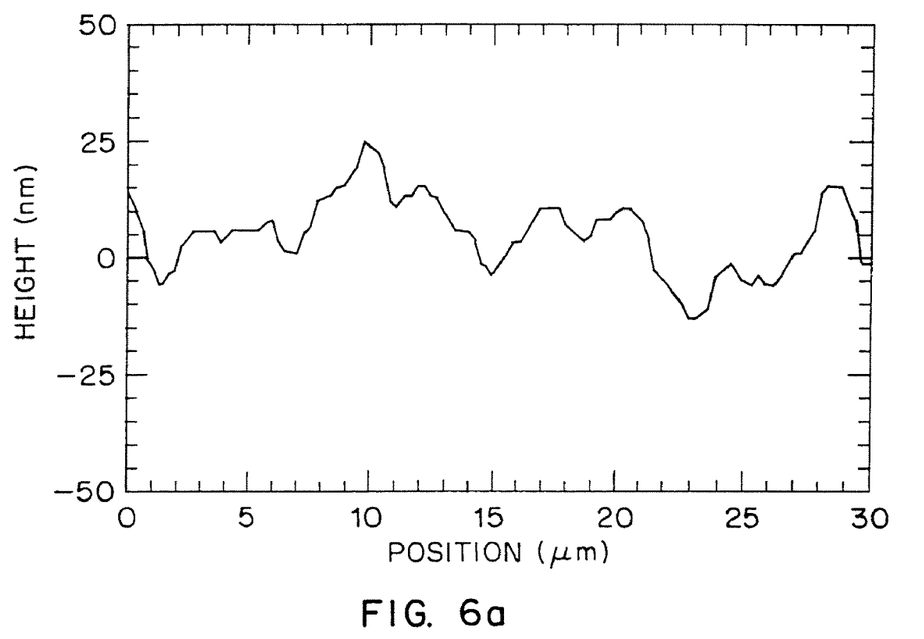
FIGS. 6-7 are charts showing the surface profile of a typical film before and after processing by the system of FIG. 3.
Figure 6B:
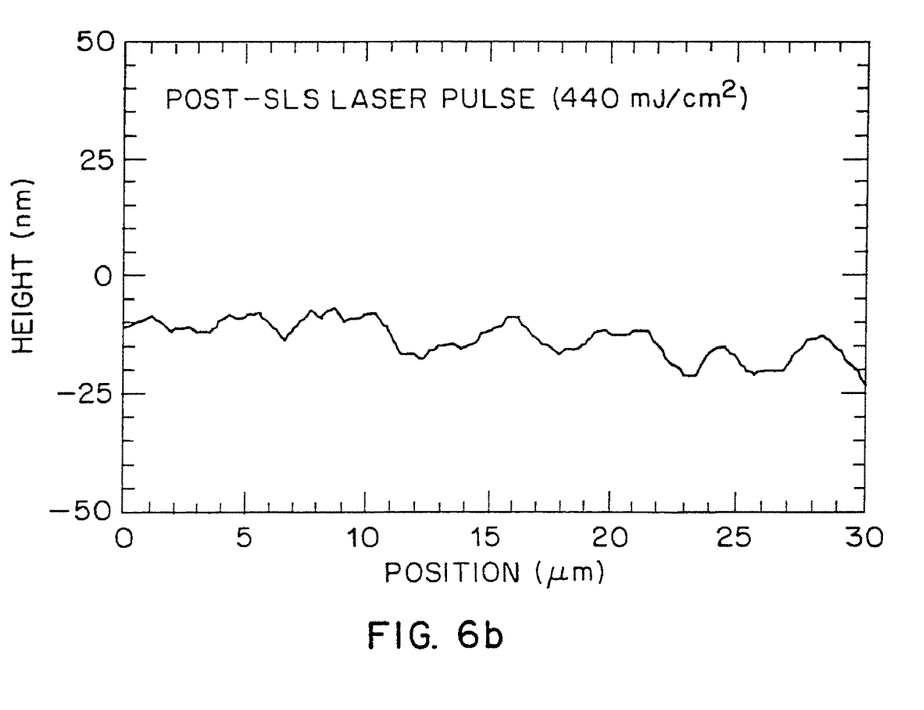
Figure 7:
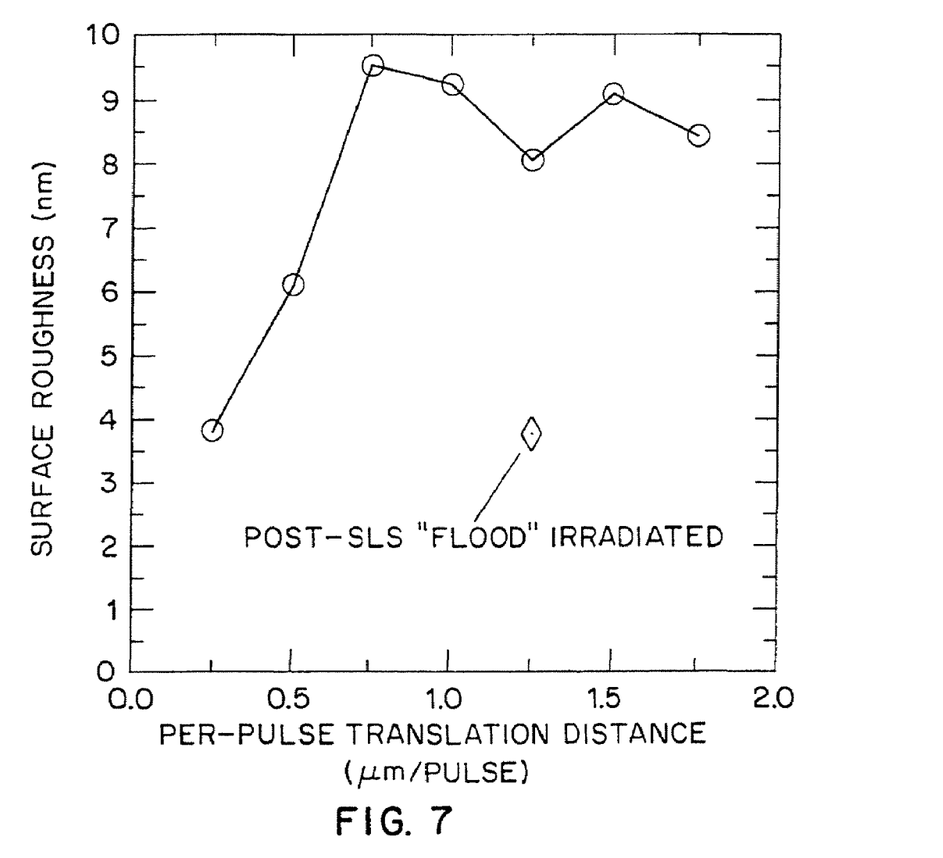

As shown in FIG. 6-7, the results of the process described with reference to FIGS. 3-4a are illustrated. The profile of a sample 360 fabricated in accordance with the sequential lateral solidification process is shown in FIG. 6a. The sample exhibits surface irregularities of +/−25 nm from the optimal 200 nm height. As shown in FIG. 6b, after post processing with a single laser pulse in accordance with the present invention, those surface irregularities are markedly reduced. These results are alternatively illustrated in FIG. 7, where it is shown >100% decrease in surface roughness caused by post processing in accordance with the invention herein.

Figure 8:
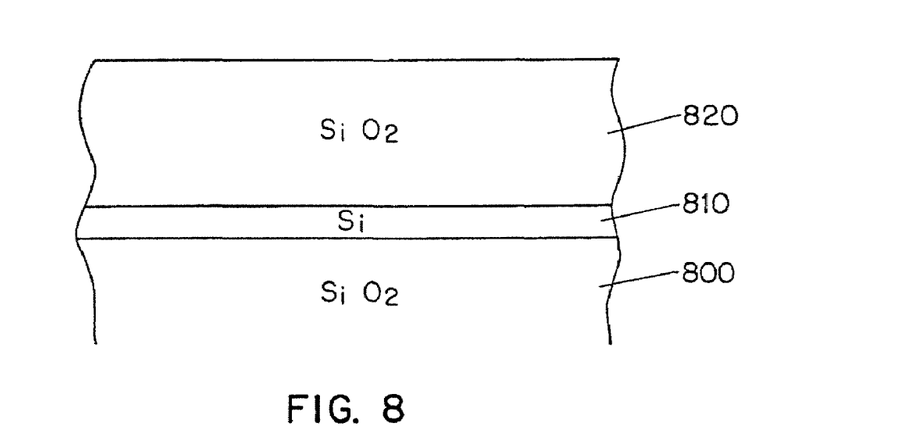
FIG. 8 is an illustrative diagram of a cross section of a crystallized silicon film processed by the system of FIG. 1 in accordance with a second embodiment of the present invention.

Referring next to FIG. 8, a second embodiment of the present invention will now be described. In this embodiment, the surface of silicon thin film is kept planarized through the employment of a rigid cap layer during the sequential lateral solidification process. Thus, FIG. 8 shows a thin silicon sample formed of an approximately 50-200 nm thick amorphous silicon layer 810 deposited on a silicon oxide base layer 820. The sample is capped with a thick second silicon oxide layer 820, approximately 2 microns thick, which is substantially rigid. The cap layer must be sufficiently thick to withstand the contractions and expansions during melting and resolidification of the silicon layer during the sequential lateral solidification process.

Figure 9:
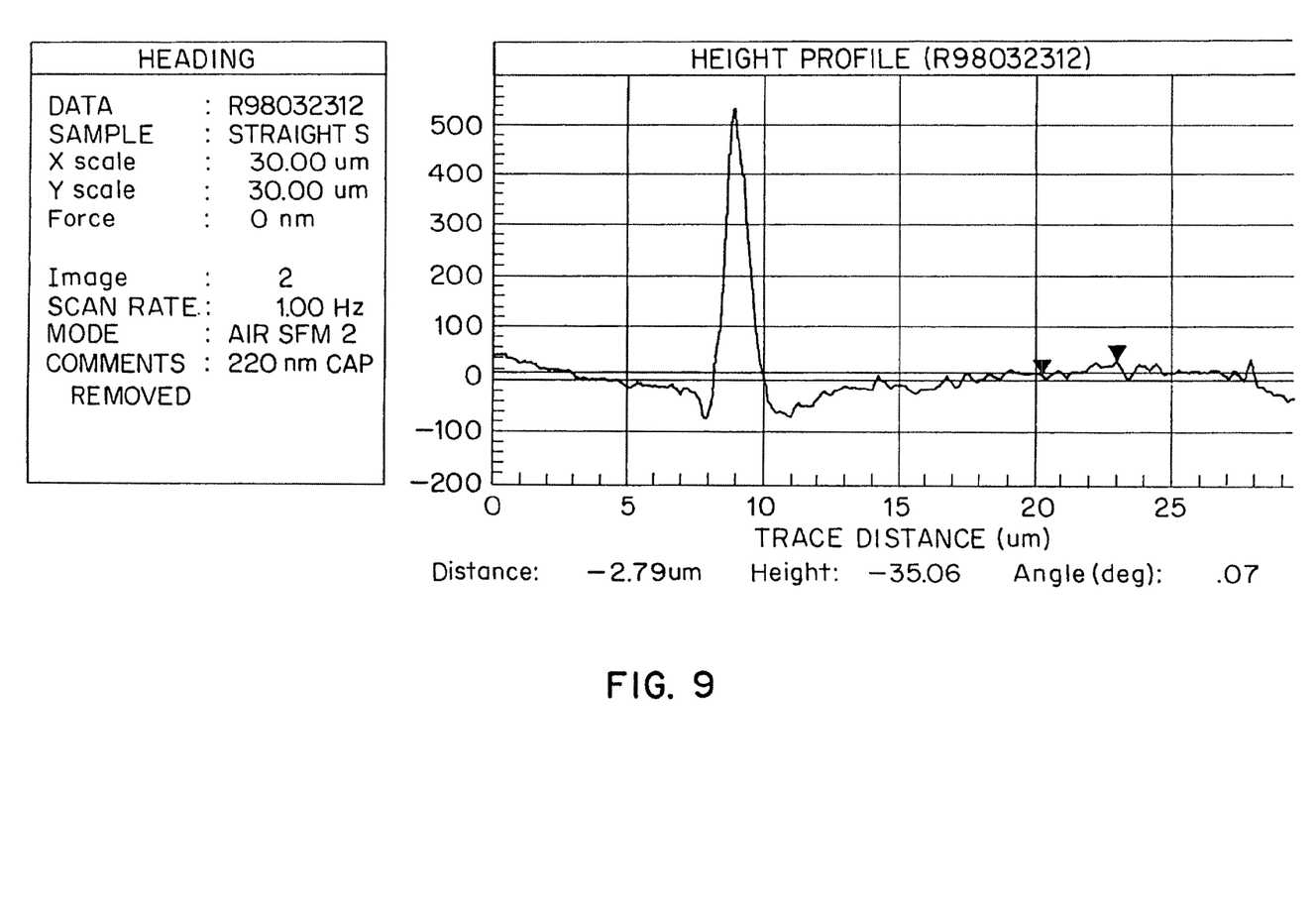
FIG. 9 is a chart showing the surface profile of a typical film which has been processed in accordance with the second embodiment of the present invention.

The sample with cap layer 830 are then used in place of sample 170 in the lateral solidification process, a complete description of which is contained in the above mentioned patent application Ser. No. 09/390,537. After such processing, the cap layer 830 is removed from the sample by traditional wet or dry etching techniques. As shown in FIG. 9, the results of the process described with reference to FIG. 8 is illustrated.

Figure 10:
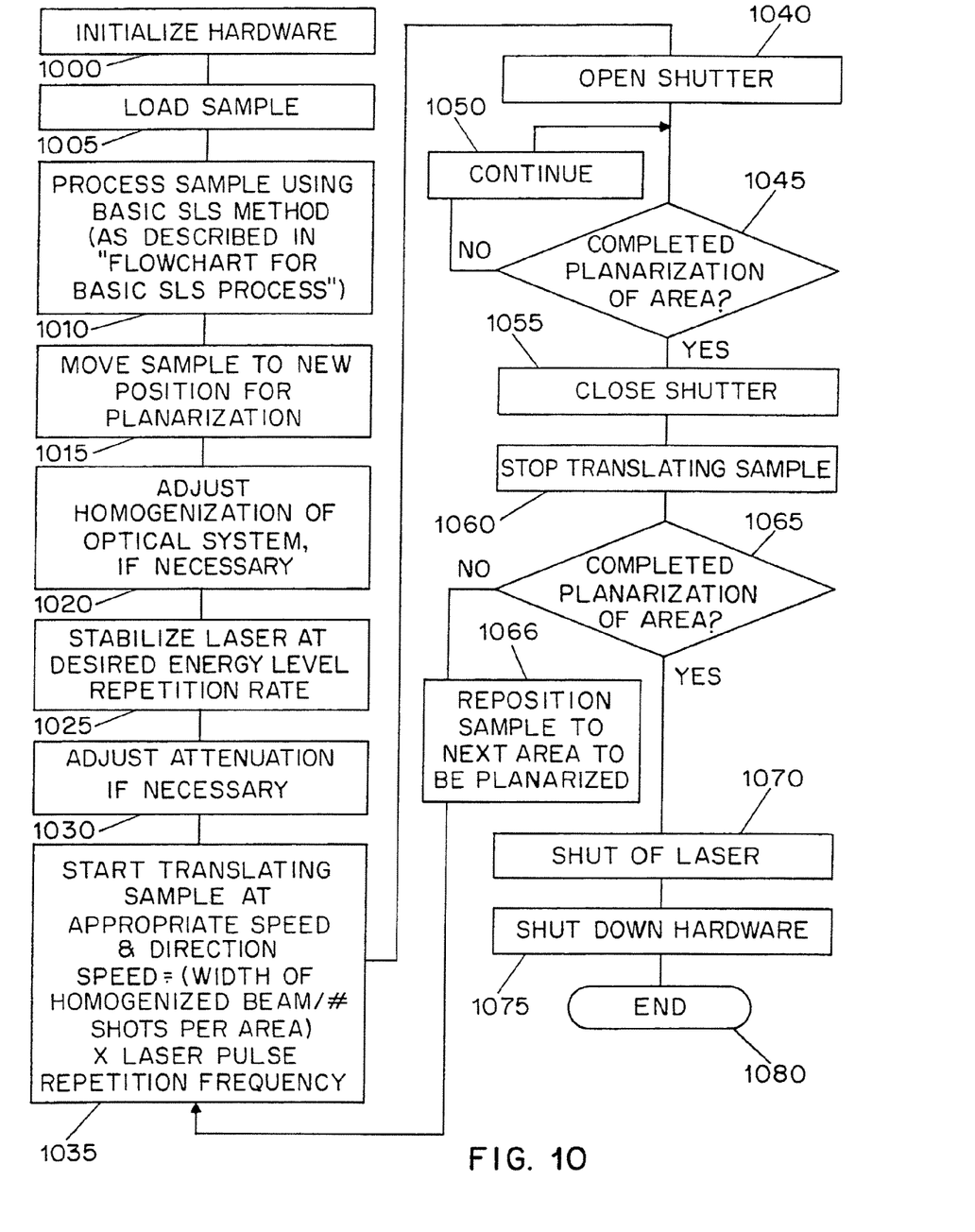
FIG. 10 is a flow diagram illustrating the steps implemented in the system of FIG. 3 in accordance with the first embodiment of the present invention.

Referring to FIG. 10, the steps executed by computer 300 to control both the sequential lateral solidification process of FIG. 1 and the surface planarization process implemented with respect to FIG. 3 will be described. The various electronics of the system are initialized 1000 by the computer 300 to initiate the process. A sample is then loaded onto the sample translation stage 1005. It should be noted that such loading may be either manual or robotically implemented under the control of computer 300. Next, the sample is processed in accordance with the sequential lateral solidification process using the apparatus of FIG. 1 1010. The processed sample is positioned for planarization 1015. The various optical components of the system are focused 1020 if necessary. The laser is then stabilized 1025 to a desired energy level and reputation rate, as needed to partially melt the sample in accordance with the teachings of the present invention. If necessary, the attenuation of the laser pulses is finely adjusted 1030.

Next, translation of the sample is commenced 1035 at a predetermined speed and in a predetermined direction, in accordance with the previously sequential lateral solidification processed regions of the sample. The shutter is opened 1040 to expose the sample to irradiation and accordingly, to commence the planarization process.

Sample translation and irradiation continues until planarization has been competed 1045, 105, at which time the computer closes the shutter and stops translation 1055, 1060. If other areas on the sample have been designated for planarization, the sample is repositioned 1065, 1066 and the process is repeated on the new area. If no further areas have been designated for planarization, the laser is shut off 1070, the hardware is shut down 1075, and the process is completed 1080.

Figure 11:
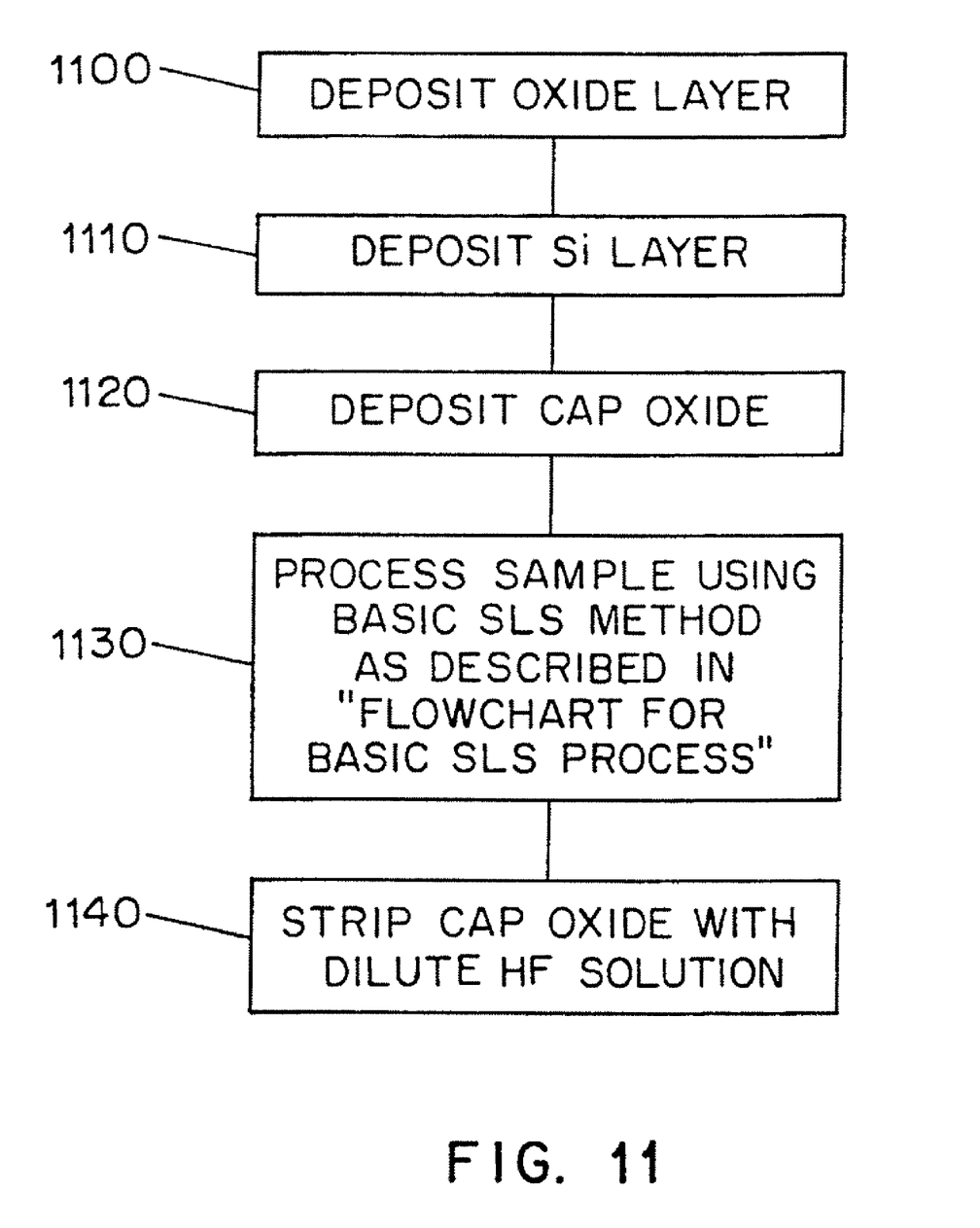
FIG. 11 is a flow diagram illustrating steps implemented in the system of FIG. 1 in accordance with the second embodiment of the present invention.

Referring next to FIG. 11, the steps executed by computer 100 to control the crystal growth process with the surface planarization steps implemented with respect to FIG. 1 will be described. FIG. 10 is a flow diagram illustrating the basic steps implemented in the system of FIG. 1 using a capped sample as illustrated in FIG. 8. An oxide layer is deposited on a base 1100. A silicon layer is then deposited on the oxide buffer layer 1110, and a cap oxide is deposited at the top layer of the sample 1120.

Next, the sample is processed in accordance with the sequential lateral solidification process using the apparatus of FIG. 1 1030. After processing, the cap oxide is removed, e.g., by a dilute hydrofluoric acid solution.

The foregoing merely illustrates the principles of the invention. Various modifications and alterations to the described embodiments will be apparent to those skilled in the art in view of the teachings herein. For example, while removal of the cap layer had been disclosed with respect to use of a dilute hydrofluoric acid solution, the cap layer may be removed by any. conventional technique such as dry etching. It will thus be appreciated that those skilled in the art will be able to devise numerous systems and methods which, although not explicitly shown or described herein, embody the principles of the invention and are thus within the spirit and scope of the invention.

The invention claimed is:

1. A system for reducing a surface roughness of a polycrystalline or single crystal thin film produced by the sequential lateral solidification process, comprising: (a) an excimer laser for generating a plurality of excimer laser pulses of a predetermined fluence; (b) an energy density modulator, optically coupled to said excimer laser, for controllably modulating said fluence of said excimer laser pulses emitted by said excimer laser such that said fluence is below that which is required to completely melt said polycrystalline or single crystal thin film; (c) a beam homoginizer, optically coupled to said energy density modulator, for homogenizing said modulated laser pulses in a predetermined plane; (d) a sample stage, optically coupled to said mask, for receiving said homogenized laser pulses to effect partial melting of portions of said polycrystalline or single crystal thin film corresponding to said laser pulses; (f) translating means, coupled to said sample stage, for controllably translating a relative position of said sample stage with respect to said laser pulses; and (g) a computer, coupled to said excimer laser, said energy density modulator, and said translating means, for controlling said controllable fluence modulation of said excimer laser pulses and said controllable relative positions of said sample stage and said laser pulses, and for coordinating said excimer pulse generation and said fluence modulation with said relative positions of said sample stage and said laser pulses, to thereby process said polycrystalline or single crystal thin film by sequential translation of said sample stage relative to said laser pulses at corresponding sequential locations thereon.

2. The system of claim 1, wherein said excimer laser is a ultraviolet excimer laser for generating ultraviolet excimer laser pulses.

3. The system of claim 1, wherein said beam homoginizer is operable to shape said laser pulses with a tophat profile in both the x and y directions.

4. The system of claim 1, wherein said an energy density modulator is operable to attenuate said fluence of said excimer laser pulses to approximately 25% to 75% of the full melt threshold of said polycrystalline or single crystal thin film.

5. The system of claim 1, wherein said translating means comprises said sample stage, and wherein said sample stage includes a Y direction translation portion coupled to said computer and permitting movement in one direction orthogonal to a direction of said laser pulses and being controllable by said computer for controllably translating said polycrystalline or single crystal thin film in said translatable direction under control of said computer.

6. The system of claim 5, wherein said beam homoginizer is operable to shape said laser pulses with a tophat profile in at least said direction orthogonal to a direction of said laser pulses, and wherein said translating means is operable to translate said polycrystalline or single crystal thin film in said direction orthogonal to a direction of said laser pulses, such that sequential homogenized laser pulses are incident on slightly overlapping regions of said polycrystalline or single crystal thin film.

7. The system of claim 1, wherein said translating means comprises said sample stage, and wherein said sample stage includes an X direction translation portion and a Y direction translation portion, each being coupled to said computer and to each other, said X and Y direction translation portions permitting movement in two orthogonal directions that are perpendicular to a path formed by said laser pulses and being controllable by said computer for controllably translating said sample in both of said translatable directions under control of said computer.

8. The system of claim 7, wherein said beam homoginizer is operable to shape said laser pulses with a tophat profile in both the x and y directions, and wherein said translating means is operable to translate said polycrystalline or single crystal thin film in two directions orthogonal to a direction of said laser pulses, such that sequential homogenized laser pulses are incident on slightly overlapping regions of said polycrystalline or single crystal thin film in said two directions.

* * * * *